US012796149B2

(12) United States Patent
Son

(10) Patent No.: US 12,796,149 B2
(45) Date of Patent: Nov. 10, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventor: Bongjin Son, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 441 days.

(21) Appl. No.: 18/446,920

(22) Filed: Aug. 9, 2023

(65) Prior Publication Data

US 2024/0222409 A1 Jul. 4, 2024

(30) Foreign Application Priority Data

Jan. 2, 2023 (KR) ........................ 10-2023-0000091

(51) Int. Cl.
*H10F 39/00* (2025.01)

(52) U.S. Cl.
CPC ....... *H10F 39/811* (2025.01); *H10F 39/8037* (2025.01)

(58) Field of Classification Search
CPC .. H10F 39/811; H10F 39/8037; H01L 23/481; H01L 23/482; H01L 23/5222; H01L 24/04; H01L 24/07; H01L 2224/02331; H01L 2224/0235; H01L 2224/023; H01L 2224/02372; H01L 2224/02381
See application file for complete search history.

(56) References Cited

U.S. PATENT DOCUMENTS 8,563,350 B2 10/2013 Tu et al.
9,177,919 B2 11/2015 Liu et al.
9,960,102 B2 5/2018 Wu et al.
(Continued)

FOREIGN PATENT DOCUMENTS

CN 108269776 A 7/2018
CN 111868916 A 10/2020
(Continued)

OTHER PUBLICATIONS

English translation of KR-101088825-B1 (Year: 2011).*

*Primary Examiner* — William B Partridge
*Assistant Examiner* — David Paul Sedorook
(74) *Attorney, Agent, or Firm* — Wolf, Greenfield & Sacks, P.C.

(57) ABSTRACT

A semiconductor package includes a silicon substrate having a first surface and a second surface opposite to the first surface, the silicon substrate including an active layer on the first surface, the active layer having a through opening area and a circuit pattern area surrounding the through opening area and in which circuit patterns are provided. A through electrode penetrates the silicon substrate and has a first end portion that is exposed at the first surface of the silicon substrate on the through opening area. A redistribution wiring layer is on the first surface of the silicon substrate and includes a landing pad and redistribution wires. The landing pad is electrically connected to the first end portion of the through electrode, and the redistribution wires are electrically connected to the landing pad and the circuit patterns.

20 Claims, 14 Drawing Sheets

(56) References Cited

U.S. PATENT DOCUMENTS

| | | | | |
|---|---|---|---|---|
| 10,026,666 | B2 | 7/2018 | Juneja et al. | |
| 10,896,888 | B2 | 1/2021 | Sato et al. | |
| 10,950,648 | B2 | 3/2021 | Sasaki | |
| 11,075,306 | B2 | 7/2021 | Su | |
| 2011/0084410 | A1* | 4/2011 | Yoon | H01L 23/48 257/784 |
| 2011/0210432 | A1* | 9/2011 | Goto | H01L 23/4951 438/109 |
| 2012/0049366 | A1* | 3/2012 | Zeng | H01L 24/19 257/738 |
| 2013/0037942 | A1* | 2/2013 | Hwang | H01L 23/48 257/737 |
| 2013/0122658 | A1* | 5/2013 | Savic | H01L 23/49838 438/126 |
| 2015/0108605 | A1* | 4/2015 | Park | H10B 12/0335 257/532 |
| 2018/0166350 | A1* | 6/2018 | Racz | H01L 21/4842 |
| 2020/0411462 | A1 | 12/2020 | Sato et al. | |
| 2021/0111140 | A1* | 4/2021 | Jang | H01L 25/0657 |
| 2021/0202448 | A1 | 7/2021 | Chuang et al. | |
| 2022/0051968 | A1 | 2/2022 | Wu | |

FOREIGN PATENT DOCUMENTS

| | | | | |
|---|---|---|---|---|
| KR | 101088825 | B1 * | 12/2011 | H10W 90/00 |
| KR | 10-2015-0057140 | A | 5/2015 | |
| KR | 10-1968351 | B1 | 8/2019 | |
| KR | 10-2020-0009644 | A | 1/2020 | |
| KR | 10-2022-0122891 | A | 9/2022 | |

* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2023-0000091, filed on Jan. 2, 2023 in the Korean Intellectual Property Office (KIPO), the disclosure of which is herein incorporated by reference in its entirety.

BACKGROUND

1. Field

Example embodiments relate to semiconductor packages and methods of manufacturing semiconductor packages. More particularly, example embodiments relate to semiconductor packages including through electrodes that penetrate a silicon substrate in a thickness direction and methods of manufacturing such semiconductor packages.

2. Description of the Related Art

A semiconductor package may use through silicon via (TSV) to electrically connect different semiconductor chips, and the through silicon via may be electrically connected to circuit patterns of an active layer through a metal layer having redistribution wires. Landing pads may be used to electrically connect the through silicon vias with the redistribution wires, and there may be a need to extend the metal layer from the through silicon vias towards the circuit patterns to form the landing pads. Since the landing pad reduces space utilization of the semiconductor package, there may be problems with design and space restrictions, as well as with lower yields of semiconductor packages.

SUMMARY

Example embodiments provide semiconductor packages having a structure that is able to increase space utilization by forming through opening regions through which through silicon vias are provided in an active layer having circuit patterns.

Example embodiments provide methods of manufacturing the semiconductor packages.

According to example embodiments, a semiconductor package includes a silicon substrate having a first surface and a second surface opposite to the first surface. An active layer is on the first surface and has a through opening area and a circuit pattern area surrounding the through opening area and in which circuit patterns are located. A through electrode penetrates the silicon substrate and has a first end portion that is exposed at the first surface of the silicon substrate on the through opening area. A redistribution wiring layer is on the first surface of the silicon substrate and includes a landing pad and redistribution wires. The landing pad is electrically connected to the first end portion of the through electrode, and the redistribution wires are electrically connected to the landing pad and the circuit patterns.

According to example embodiments, a semiconductor package includes a silicon substrate having a front surface and a back surface opposite the front surface An active layer is on the front surface and has a through opening area and a circuit pattern area surrounding the through opening area and in which circuit patterns are located. A through electrode penetrates at least a portion of the silicon substrate and has a first end portion that is exposed at the front surface of the silicon substrate on the through opening area. A redistribution wiring layer is on the front surface of the silicon substrate and includes a landing pad and redistribution wires. The landing pad is electrically connected to the through electrode, and the redistribution wires are electrically connected to the landing pad and the circuit patterns.

According to example embodiments, a semiconductor package includes a silicon substrate having a first surface and a second surface opposite to the first surface. An active layer is on the first surface and includes circuit patterns. The active layer has a through opening area and a circuit pattern area surrounding the through opening area and in which the circuit patterns are located. A through electrode penetrates at least a portion of the silicon substrate and has a first end portion that is exposed at the first surface of the silicon substrate and a second end portion that is opposite to the first end portion. A redistribution wiring layer is on the first surface of the silicon substrate and includes a landing pad and redistribution wires. The landing pad is electrically connected to the first end portion of the through electrode, and the redistribution wires are electrically connected to the landing pad and the circuit patterns. A bonding pad is on a second end portion opposite to the first end portion of the through electrode and is electrically connected to the redistribution wiring layer through the through electrode.

According to example embodiments, a semiconductor package may include a silicon substrate having a first surface and a second surface opposite to the first surface. An active layer is on the first surface and has a through opening area and a circuit pattern area surrounding the through opening area and in which circuit patterns are located. A through electrode penetrates the silicon substrate and has a first end portion that is exposed at the first surface of the silicon substrate on the through opening area. A redistribution wiring layer is on the first surface of the silicon substrate and includes a landing pad and redistribution wires. The landing pad is electrically connected to the first end portion of the through electrode, and the redistribution wires are electrically connected to the landing pad and the circuit patterns.

Thus, the active layer may have the through opening area in which the through electrode is formed. Since the through opening area is not provided with the circuit patterns, the through electrode may not interfere with movement of an electrical signal within the semiconductor package. The landing pad electrically connected to the first end portion of the through electrode may be provided on the through opening area.

Since the through opening area, in which the through electrode is provided, is provided in the circuit pattern area in which the circuit patterns are provided, the landing pad may be provided between second landing pads that are electrically connected to the circuit patterns. Since the landing pad is provided between the second landing pads, lengths of the redistribution wires connecting the landing pads to each other may be shortened. Since the lengths of the redistribution wires are shortened, space utilization of the redistribution wiring layer (metal layer) may be increased.

BRIEF DESCRIPTION OF THE DRAWINGS

Example embodiments will be more clearly understood from the following detailed description taken in conjunction with the accompanying drawings.

FIG. 1 is a view illustrating a semiconductor package in accordance with example embodiments.

FIG. 2 is an enlarged cross-sectional view illustrating portion 'A' in FIG. 1.

FIG. 3 is a perspective view illustrating a through opening area and a circuit pattern area in FIG. 1.

FIGS. 4 to 11 are views illustrating a method of manufacturing the semiconductor package in FIG. 1.

FIG. 12 is a view illustrating a semiconductor device having a semiconductor package in accordance with example embodiments.

FIG. 13 is an enlarged cross-sectional view illustrating portion 'E' in FIG. 12.

FIG. 14 is a perspective view illustrating a through opening area and a circuit pattern area in FIG. 12.

DETAILED DESCRIPTION OF EXAMPLE EMBODIMENTS

Hereinafter, example embodiments will be explained in detail with reference to the accompanying drawings.

Figure 1:
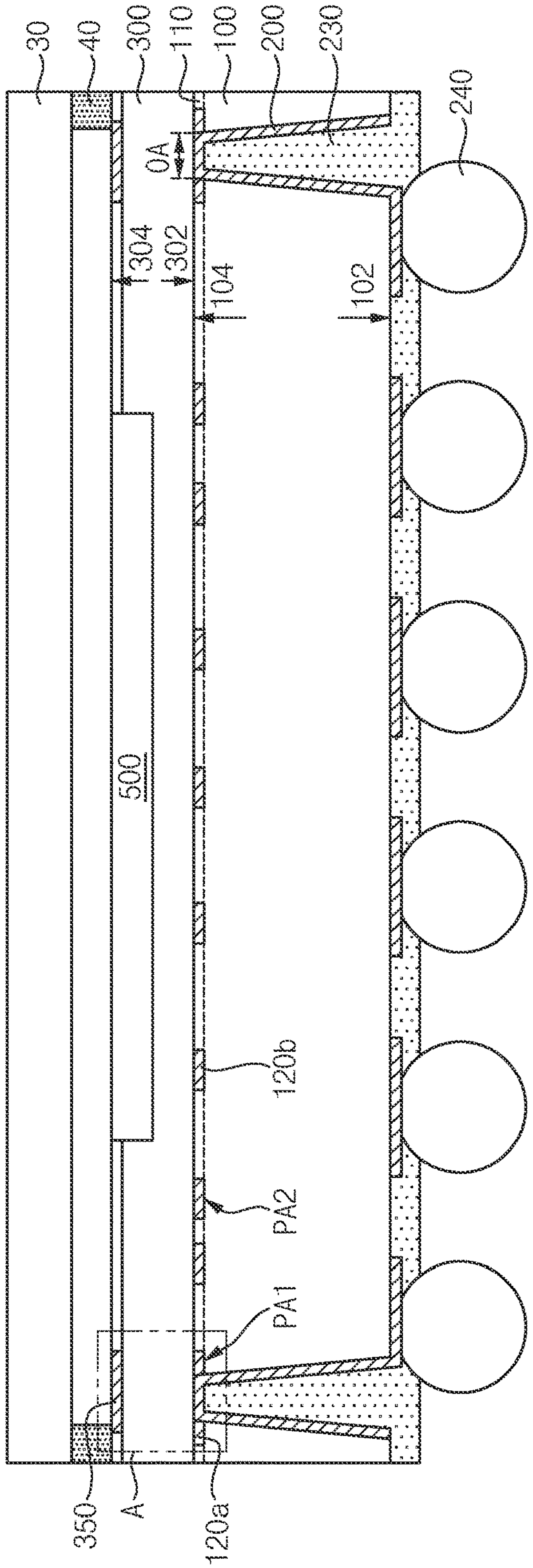
FIGS. 1 to 14 represent non-limiting, example embodiments as described herein.
Figure 2:
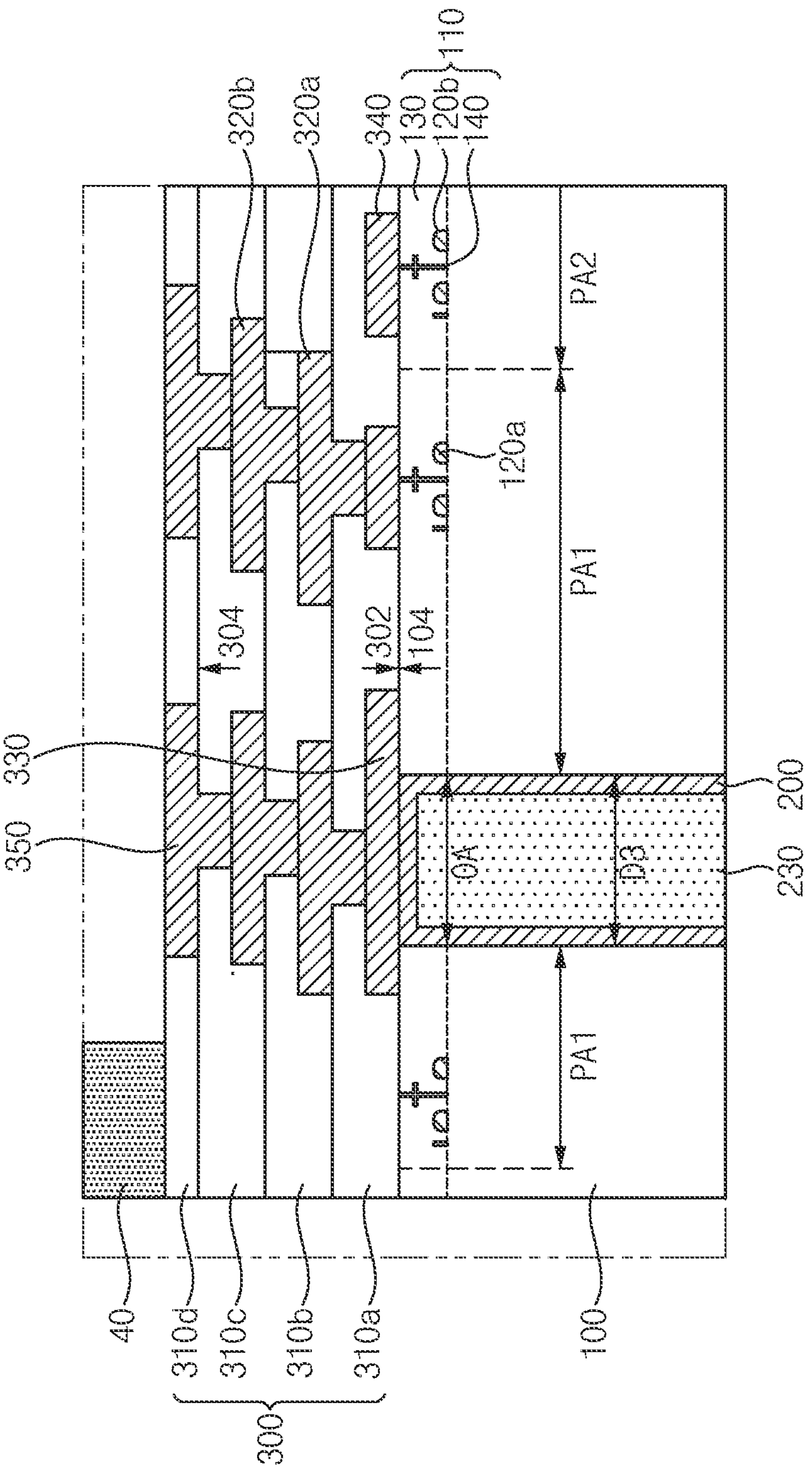
Figure 3:
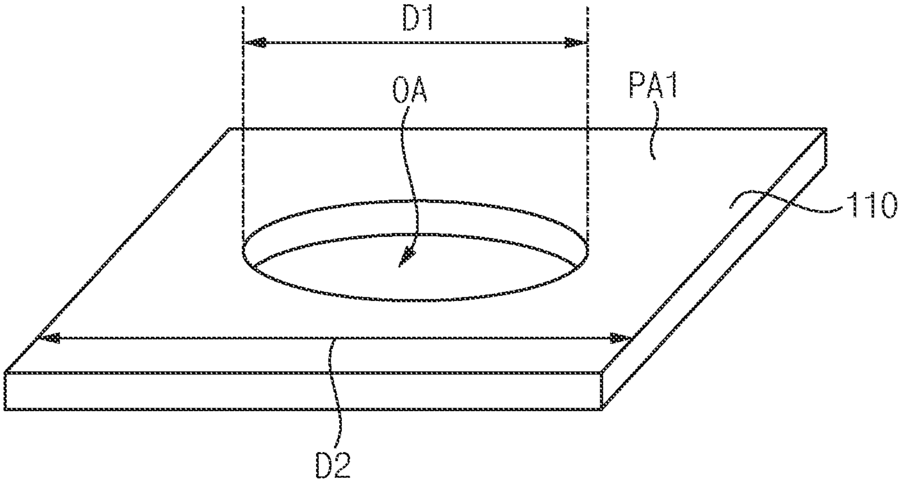

FIG. 1 is a view illustrating a semiconductor package in accordance with example embodiments. FIG. 2 is an enlarged cross-sectional view illustrating portion 'A' in FIG. 1. FIG. 3 is a perspective view illustrating a through opening area and a circuit pattern area in FIG. 1.

Referring to FIGS. 1 to 3, a semiconductor package 10 may include a silicon substrate 100 having an active layer 110, a redistribution wiring layer 300 provided on a front surface of the silicon substrate 100, and an optical component 500 provided on the redistribution wiring layer 300. For example, the semiconductor package 10 may be a semiconductor module that is provided as an image sensor chip.

For example, the image sensor chip may include a complementary metal oxide semiconductor (CMOS) image sensor chip. The CMOS image sensor (CIS) chip may include an active pixel area for capturing an image and a CMOS logic area for controlling an output signal of the active pixel area. The active pixel area may include a photodiode and a MOS transistor, and the CMOS logic area may include a plurality of CMOS transistors.

In example embodiments, the silicon substrate 100 may have a first surface 102 and a second surface 104 opposite to the first surface 102. The first surface 102 of the silicon substrate 100 may be referred to as an inactive surface, and the second surface 104 may be referred to as an active surface. The active layer 110 having circuit patterns may be provided on the second surface 104 of the silicon substrate 100. The second surface 104 may be referred to as a front side surface on which the circuit patterns are formed, and the first surface 102 may be referred to as a backside surface.

For example, the silicon substrate 100 may include silicon, germanium, silicon-germanium, or III-V compound semiconductors, e.g., gallium phosphide (GaP), gallium arsenide (GaAs), gallium antimonide (GaSb), etc. The silicon substrate 100 may include a silicon-on-insulator (SOI) substrate or a germanium-on-insulator (GOI) substrate.

The silicon substrate 100 may have the active layer 110 provided on the second surface 104. The active layer 110 may include a through opening area OA and a first circuit pattern area PA1 surrounding the through opening area OA and in which first circuit patterns 120*a* are provided. The through opening area OA may be an area where a through electrode 200 is provided. The active layer 110 may further include a second circuit pattern area PA2 in which second circuit patterns 120*b* are provided. The circuit patterns may include the first circuit patterns 120*a* provided in the first circuit pattern area PA1 and the second circuit patterns 120*b* provided in the second circuit pattern area PA2.

The through opening area OA may be an area that does not include metal materials in the active layer 110. The through opening area OA may be an area through which the through electrode 200 extends the silicon substrate 100 in a thickness direction of the silicon substrate 100. For example, the metal materials may include aluminum (Al), copper (Cu), tin (Sn), nickel (Ni), gold (Au), platinum (Pt), or an alloy thereof.

The through opening area OA of the active layer 110 may have a circular shape or a rectangular shape. The through opening area OA may include any shape that allows the through electrode 200 to extend through the active layer 110 without limitation. For example, a diameter D1 (FIG. 3) of the through opening area OA may be within a range of 40 μm to 60 μm.

The first circuit pattern area PA1 may be an area including the first circuit patterns 120*a* inside the active layer 110. The first circuit pattern area PA1 may have a circular shape or a rectangular shape. The first circuit pattern area PA1 may include any shape that allows the first circuit patterns 120*a* to be provided in the active layer 110 without limitation. For example, a length D2 (FIG. 3) of the first circuit pattern area PA1 may be within a range of 60 μm to 100 μm.

The second circuit pattern area PA2 may be an area including the second circuit patterns 120*b* inside the active layer 110. The first circuit pattern area PA1 may be spaced apart from the first circuit pattern area PA1 in the active layer 110. The active layer 110 may additionally include the circuit patterns in areas other than the first circuit pattern areas PA1 surrounding the through opening area OA through the second circuit pattern area PA2. For example, the second circuit pattern area PA2 may have a circular shape or a rectangular shape. The second circuit pattern area PA2 may include any shape that allows the second circuit patterns 120*b* to be formed in the active layer 110 without limitation.

The active layer 110 may include an interlayer insulating layer 130, and a plurality of connection wires 140 provided in the interlayer insulating layer 130. The interlayer insulating layer 130 may cover the circuit patterns on the silicon substrate 100. The plurality of connection wires 140 may be electrically connected to the circuit patterns. The connection wires 140 may be electrically connected to the redistribution wiring layer 300. The interlayer insulating layer may include silicon oxide, carbon-doped silicon oxide, silicon carbonitride (SiCN), or the like.

For example, the circuit patterns may include transistors, diodes, capacitors, and the like. The circuit patterns may constitute circuit elements. Thus, the semiconductor package 10 may be a semiconductor device in which a plurality of circuit elements are formed.

In example embodiments, the through electrode 200 may penetrate the silicon substrate 100 in a vertical direction. A first end portion of the through electrode 200 may be exposed from the second surface 104 of the silicon substrate 100 through the through opening area OA. The first end portion of the through electrode 200 may be electrically connected to the redistribution wiring layer 300. A second end portion opposite to the first end portion of the through electrode 200 may be exposed from the first surface 102 of the silicon substrate 100.

The first end portion of the through electrode 200 may be electrically connected to a first landing pad 330 of the redistribution wiring layer 300. A conductive bump 240 may be provided on the second end portion of the through electrode 200. The through electrode 200 may be electrically connected to the conductive bump 240. The through electrode 200 may transmit an electrical signal between the first landing pad 330 and the conductive bump 240. For example, a diameter D3 (FIG. 2) of the first end portion of the through electrode 200 may be within a range of 45 μm to 50 μm.

A protection member 230 may be provided on the second surface 104 of the silicon substrate 100. The protection member 230 may include an insulating material to protect the silicon substrate 100 from outside. The protection member 230 may fill up an empty space of the through electrode 200. The protection member 230 may protect the through electrode 200 from the outside (i.e., an environment external to the semiconductor package).

For example, the through electrode may include copper (Cu), aluminum (Al), tungsten (W), nickel (Ni), molybdenum (Mo), gold (Au), silver (Ag), chromium (Cr), tin (Sn) and titanium (Ti). However, it is not limited thereto, and the through electrode may include a material capable of being bonded by interdiffusion of metals by a high-temperature annealing process.

In example embodiments, the redistribution wiring layer 300 may be provided on the second surface 104 of the silicon substrate 100. The redistribution wiring layer 300 may include a plurality of redistribution wires 320. The redistribution wiring layer 300 may include a third surface 302 and a fourth surface 304 opposite to each other. The redistribution wiring layer 300 may include a plurality of redistribution pads 350 provided to be exposed from a lower surface, that is, the fourth surface 304 of the redistribution wiring layer 300. The redistribution wiring layer 300 may include the first landing pad 330 and the second landing pad 340 provided to be exposed on an upper surface, that is, the third surface 302 of the redistribution wiring layer 300.

In example embodiments, the redistribution wiring layer 300 may include a plurality of insulating layers 310*a*, 310*b*, 310*c*, and 310*d* and the plurality of redistribution wires 320*a* and 320*b* disposed in the plurality of insulating layers. The insulating layer may include a polymer or a dielectric layer. The insulating layer may be formed by a vapor deposition process, a spin coating process, or the like. The redistribution wires may be formed by a plating process, an electroless plating process, a vapor deposition process, or the like. The redistribution wires may be electrically connected to the plurality of redistribution pads 350 and the first and second landing pads 330 and 340.

In example embodiments, the insulating layers 310 may cover the redistribution wires 320. The first insulating layer (lowest insulating layer) 310*a* may be provided on the third surface 302 of the redistribution wiring layer 300, and the fourth insulating layer (uppermost insulating layer) 310*d* may be provided on the fourth surface 304 of the redistribution wiring layer 300.

Particularly, the plurality of first and second landing pads 330 and 340 may be provided in the first insulating layer 310*a*. Lower surfaces of the first and second landing pads 330 and 340 may be exposed from a lower surface of the first insulating layer 310*a*, that is, the third surface 302. The first insulating layer 310*a* may have first openings that expose upper surfaces of the first and second landing pads 330 and 340.

The plurality of redistribution wires may include first and second redistribution wires 320*a* and 320*b*. The first redistribution wire 320*a* may be provided in the second insulating layer 310*b*. The second insulating layer 310*b* may be provided on the first insulating layer 310*a* and may have second openings that expose the first redistribution wires 320*a*. The first redistribution wires 320*a* may be provided on the first and second landing pads 330 and 340. The first redistribution wires 320*a* may contact the first and second landing pads 330 and 340 through the first openings.

The second redistribution wires 320*b* may be provided in the third insulating layer 310*c*. The third insulating layer 310*c* may be provided on the second insulating layer 310*b* and may have third openings that expose the second redistribution wires 320*b*. The second redistribution wires 320*b* may be provided on the first redistribution wires 320*a*. The second redistribution wires 320*b* may contact the first redistribution wires 320*a* through the second openings.

The plurality of redistribution pads 350 may be provided in the fourth insulating layer 310*d*. The fourth insulating layer 310*d* may be provided on the third insulating layer 310*c* and may have fourth openings that expose the plurality of redistribution pads 350. The second redistribution wires 320*b* may contact the redistribution pads 350 through the third openings.

The first landing pad 330 may be electrically connected to the through electrode 200. The second landing pad 340 may be electrically connected to the first circuit pattern 120*a* through the connection wire 140. Since the through opening area OA, in which the through electrode 200 is provided, is provided in the first circuit pattern area PA1 in which the first circuit patterns 120*a* are provided, the first landing pad 330 may be provided between the second landing pads 340. Since the first landing pad 330 is provided between the second landing pads 340, a length of the redistribution wires 320 connecting the first and second landing pads 330 and 340 to each other may be shortened. Since the length of the redistribution wires 320 is shortened, space utilization in the redistribution wiring layer 300 may be increased.

The redistribution wires 320, the redistribution pad 350, and the first and second landing pads 330 and 340 may include a metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In example embodiments, a buffer layer pattern may be provided between the interlayer insulating layer 130 and the redistribution wiring layer 300. The buffer layer pattern may serve to prevent diffusion of a conductive material of the through electrode into the substrate. The buffer layer pattern may include silicon nitride, silicon carbon nitride, or the like.

As described above, the active layer 110 may have the through opening area OA in which the through electrode 200 is formed. Since the through opening area OA is not provided with the circuit patterns, the through electrode 200 may not interfere with movement of an electrical signal within the semiconductor package 10. The first landing pad 330 electrically connected to the first end portion of the through electrode 200 may be provided on the through opening area OA.

Since the through opening area OA, in which the through electrode 200 is provided, is provided in the circuit pattern area PA1 in which the circuit patterns 120*a* are provided, the first landing pad 330 may be provided between the second landing pads 340 that are electrically connected to the circuit patterns. Since the first landing pad 330 is provided between the second landing pads 340, lengths of the redistribution wires 320 connecting the first and second landing pads 330 and 340 to each other may be shortened. Since the lengths of the redistribution wires 320 are shortened, space utilization of the redistribution wiring layer (metal layer) may be increased.

Hereinafter, a method of manufacturing the semiconductor package in FIG. 1 will be described.

Figure 4:
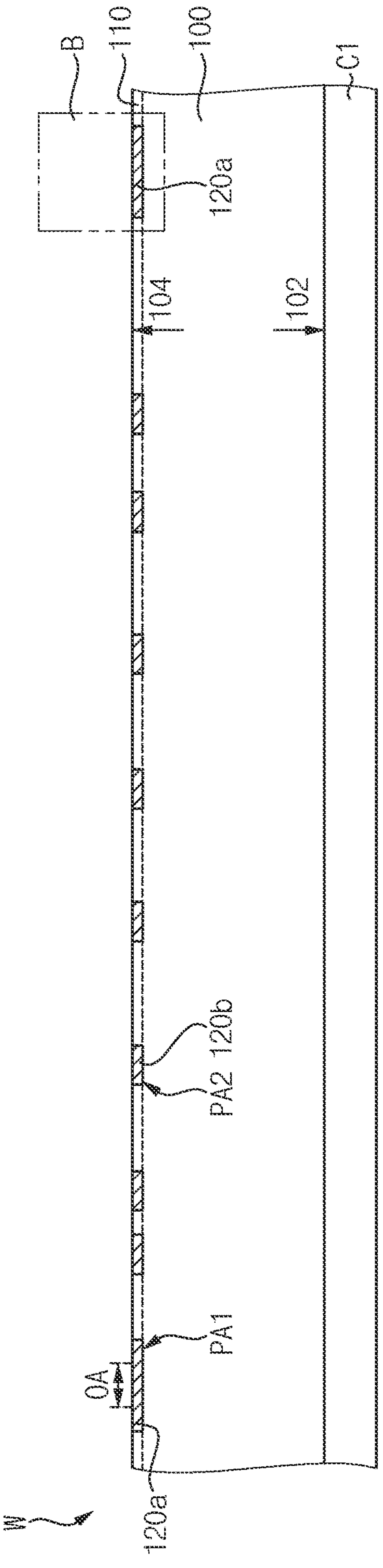
Figure 5:
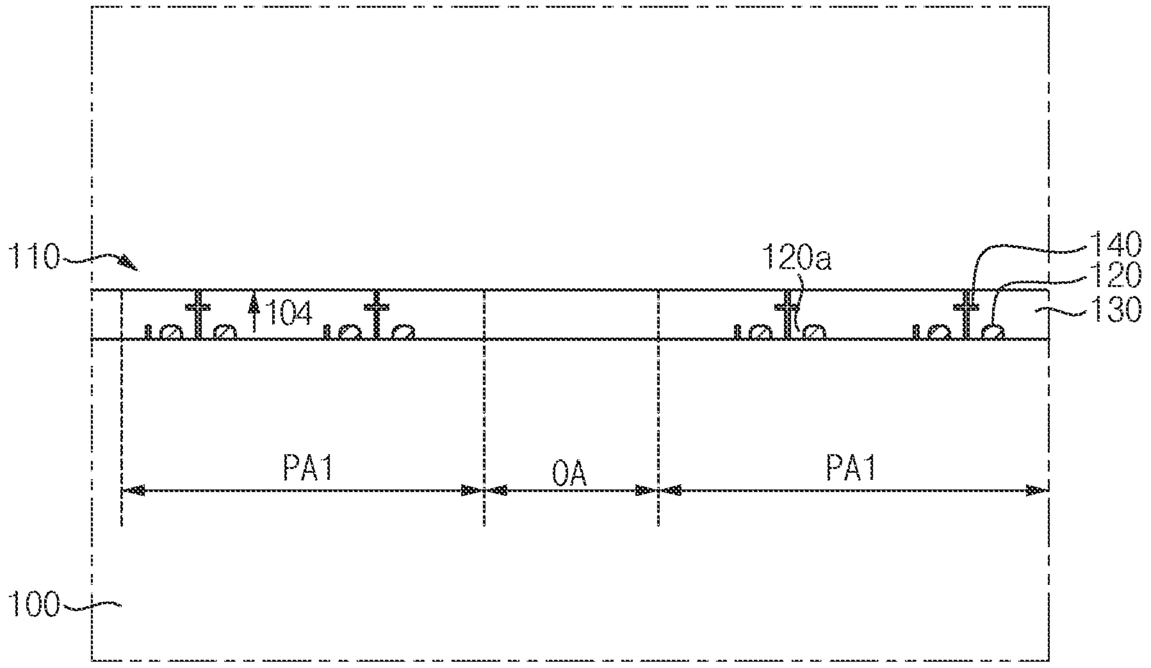
Figure 6:
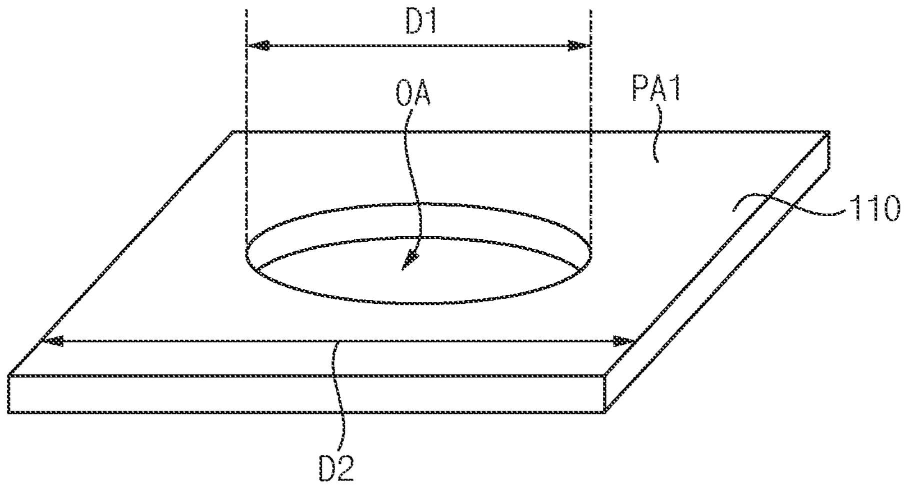

FIGS. 4 to 11 are views illustrating a method of manufacturing the semiconductor package in FIG. 1. FIG. 5 is an enlarged cross-sectional view illustrating portion 'B' in FIG. 4. FIG. 6 is a perspective view illustrating a through opening area and a circuit pattern area in FIG. 4.

Referring to FIGS. 4 to 6, first, a wafer W on which a plurality of semiconductor chips (dies) are formed may be provided.

In example embodiments, the wafer W may include a silicon substrate 100 having a first surface 102 and a second surface 104 opposite to each other, and an active layer 110 provided on the second surface 104 of the silicon substrate 100 and having circuit patterns formed therein.

For example, the silicon substrate 100 may include a semiconductor material such as silicon, germanium, or silicon-germanium. The silicon substrate 100 may include a III-V compound semiconductor such as gallium phosphide (GaP), gallium arsenide (GaAs), or gallium antimonide (GaSb). The silicon substrate 100 may include a silicon-on-insulator (SOI) substrate or a germanium-on-insulator (GOI) substrate.

As illustrated in FIG. 5, the silicon substrate 100 may provide an active layer 110 on the second surface 104. The active layer 110 may include a through opening area OA and a first circuit pattern area PA1 surrounding the through opening area. A plurality of first circuit patterns 120*a* may be formed on the first circuit pattern area PA1. The through opening area OA may be referred to as an area in which through electrodes 200 are formed. The active layer 110 may further include a second circuit pattern area PA2 in which the second circuit patterns 120*b* are formed. The circuit patterns may include the first circuit patterns 120*a* provided in the first circuit pattern area PA1, and the second circuit patterns 120*b* provided in the second circuit pattern area PA2.

As illustrated in FIG. 6, the through opening area OA may be referred to as an area that does not include metal materials in the active layer 110. The through opening area OA may be referred to as an area through which the through electrodes 200 penetrate the silicon substrate 100 in a thickness direction of the silicon substrate 100. The through opening area OA may have a circular shape or a rectangular shape. The through opening area OA may include any shape without limitation such that the through electrode 200 may penetrate the active layer 110. For example, a diameter D1 of the through opening area OA may be within a range of 40 μm to 60 μm.

The first circuit pattern area PA1 may be referred to as an area in which includes the first circuit patterns 120*a* in the active layer 110. The first circuit pattern area PA1 may have a circular shape or a rectangular shape. The first circuit pattern area PA1 may include all shapes without limitation such that the first circuit patterns 120*a* are formed in the active layer 110. The second circuit pattern area PA2 may be an area in which includes the second circuit patterns 120*b* in the active layer 110. The first circuit pattern area PA1 may be spaced apart from the first circuit pattern area PA1 in the active layer 110. For example, a length D2 of the first circuit pattern area PA1 may be within a range of 60 μm to 100 μm.

The circuit patterns may include transistors, capacitors, diodes, and the like. The circuit patterns may constitute circuit elements. Thus, the semiconductor chip may be referred to as a semiconductor device in which a plurality of circuit elements are formed. The circuit patterns may be formed on the second surface 104 of the silicon substrate 100 by performing a front end of line (FEOL) process for manufacturing semiconductor devices. A surface of the silicon substrate on which the FEOL process is performed may be referred to as a front side surface, and a surface opposite to the front side surface may be referred to as a backside surface.

The silicon substrate 100 may include a plurality of die areas where the circuit patterns and cells are formed, and a scribe lane region surrounding the die areas. The scribe lane region may divide the plurality of die areas of the wafer W. The silicon substrate 100 may be individualized by being cut along the scribe lane region by a subsequent sawing process.

Figure 7:
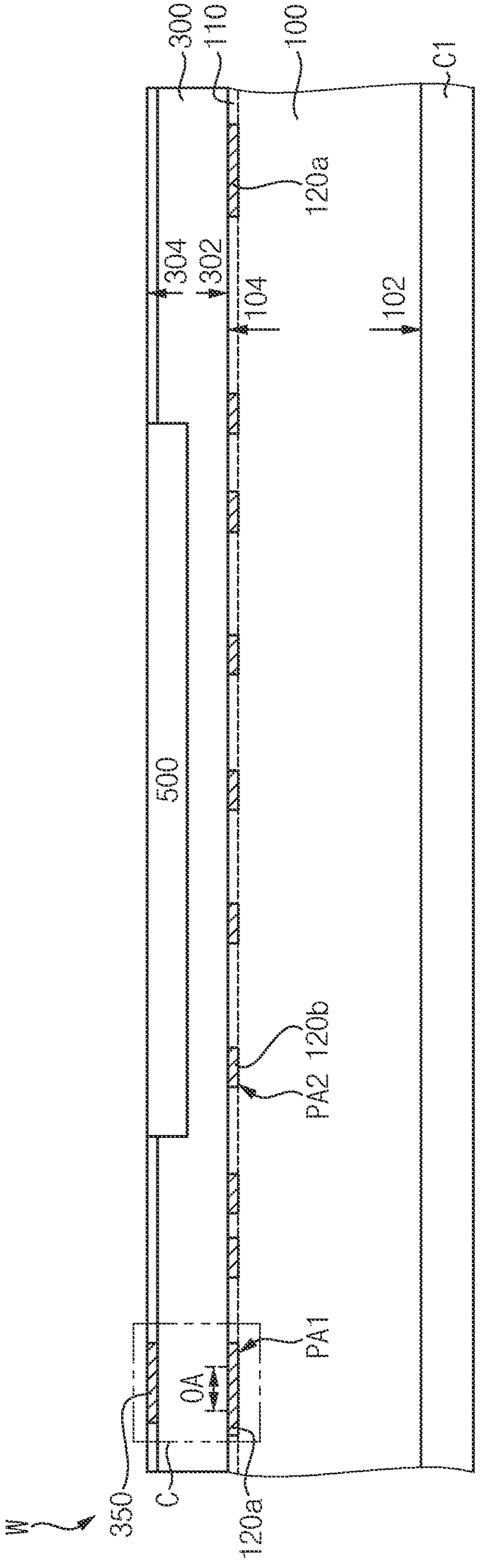
Figure 8:
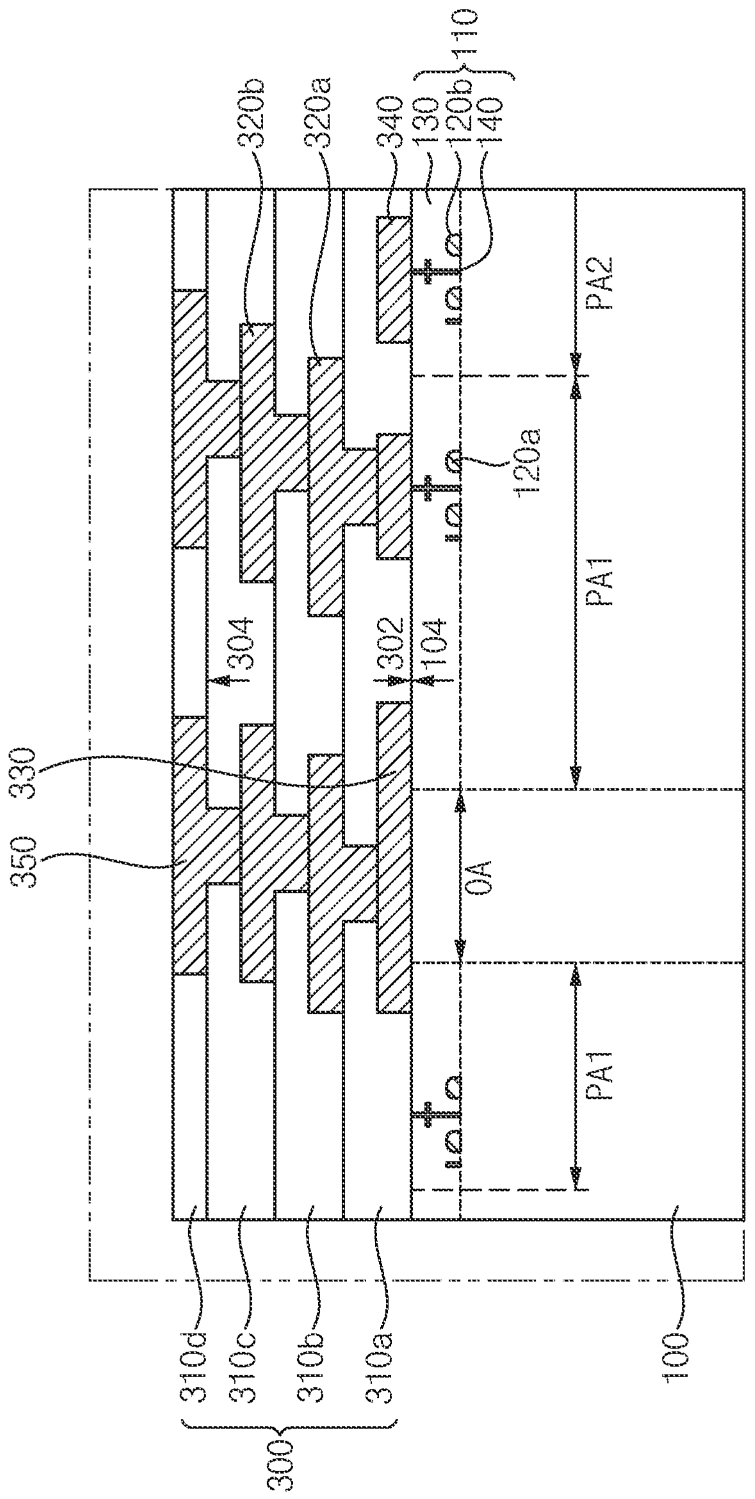

FIG. 8 is an enlarged cross-sectional view illustrating portion 'C' in FIG. 7.

Referring to FIGS. 7 and 8, a redistribution wiring layer 300 may be formed on the second surface 104 of the silicon substrate 100.

The first and second landing pads 330 and 340 may be formed on the silicon substrate 100. The first landing pads 330 may be formed on the through opening area OA where the through electrode 200 is to be formed. The second landing pads 340 may be formed on the first and second circuit pattern areas PA1 and PA2 surrounding the through opening area OA. The second landing pads 340 may be formed on connection wires 140 that are electrically connected to the circuit patterns 120.

Then, after a first insulating layer is formed 310*a* on the silicon substrate 100 to cover the first and second landing pads 330 and 340, the first insulating layer 310*a* may be patterned to form first openings that expose the first and second landing pads 330 and 340.

First redistribution wires 320*a* may be formed on the first insulating layer 310*a* to directly contact the first and second landing pads 330 and 340 through the first openings. After a seed layer is formed on a portion of the first insulating layer 310*a* and in the first openings, the seed layer may be patterned and an electroplating process may be performed to form the first redistribution wires 320*a*. Thus, at least a portion of the first redistribution wires 320*a* may directly contact the first and second landing pads 330 and 340 through the first openings.

Then, after a second insulating layer 310*b* is formed on the first insulating layer 310*a* to cover the first redistribution wires 320*a*, the second insulating layer 310*b* may be patterned to form second openings that expose the first redistribution wires 320*a*. The second redistribution wires 320*b* directly contacting the first redistribution wires 320*a* through the second openings may be formed on the second insulating layer 310*b*.

Then, after a third insulating layer 310*c* is formed on the second insulating layer 310*b* to cover the second redistribution wires 320*b*, the third insulating layer 310*c* may be patterned to form third openings that expose the second redistribution wires 320*b*. Redistribution pads 350 directly contacting the second redistribution wires 320*b* through the third openings may be formed on the third insulating layer 310*c*.

Then, after a fourth insulating layer 310*d* is formed on the third insulating layer 310*c* to cover the redistribution pads 350, the fourth insulating layer 310*d* may be patterned to form fourth openings that expose the redistribution pads 350.

Figure 9:
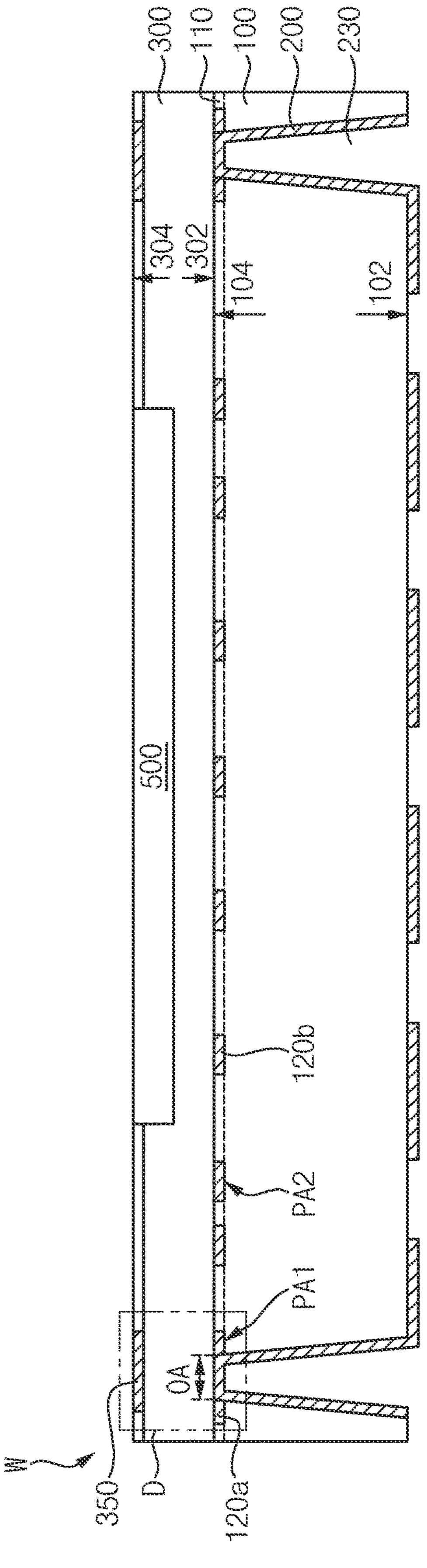
Figure 10:
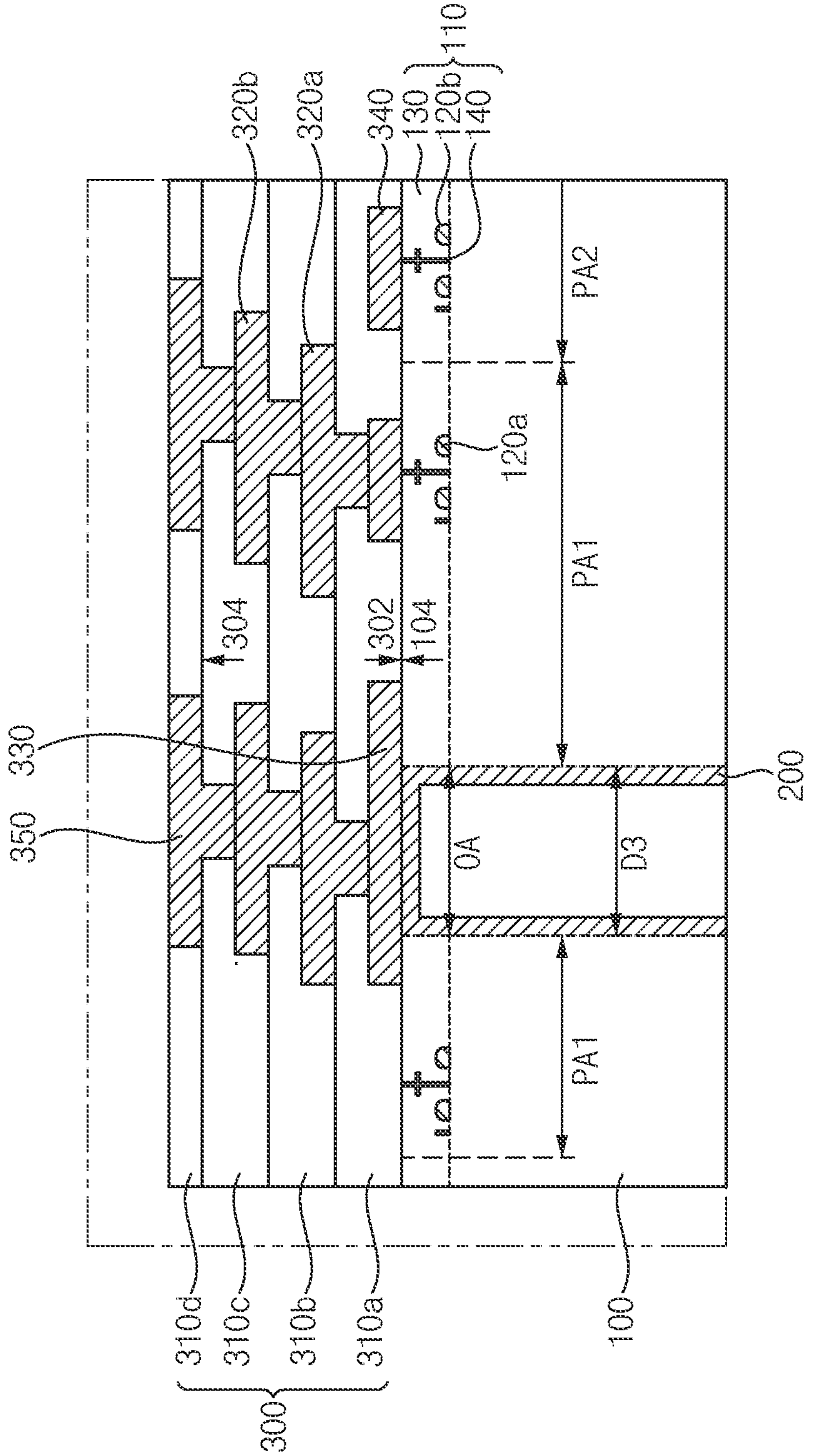

FIG. 10 is an enlarged cross-sectional view illustrating portion 'D' in FIG. 9.

Referring to FIGS. 9 and 10, through electrodes 200 may be formed to penetrate the silicon substrate 100 in a first or vertical direction.

First, one surface of the silicon substrate 100 may be covered through a photoresist layer. Then, an exposure process may be performed on the photoresist layer to form a photoresist pattern that exposes regions of the through electrodes 200. Then, an etching process may be performed on the photoresist pattern to form through openings. The through openings may be formed on the through opening area OA of the silicon substrate 100. For example, the etching process may include a wet etching process, a dry etching process, a plasma etching process, and the like.

Then, a seed layer may be formed on the through openings. The seed layer may allow the through electrode 200 to be formed in the through opening. For example, the seed layer may include titanium (Ti), titanium nitrogen compound (TiN), titanium oxygen compound ($TiO_2$), chromium nitrogen compound (CrN), titanium carbon nitrogen compound (TiCN), titanium aluminum nitrogen compound (TiAlN), or alloys thereof. The seed layer may be formed by a sputtering process.

The through electrodes 200 may be formed within the through openings that penetrate the silicon substrate 100 in the vertical direction. A conductive material may be introduced into the through openings to form the through electrodes 200. The conductive material may be hardened in the through openings to form the through electrodes 200. The through electrodes 200 may be formed on the through opening area OA.

A plating process may be performed on the through openings to form the through electrodes 200. For example, the through electrodes 200 may be formed by a plating process, an electroless plating process, a vapor deposition process, or the like. For example, the through electrodes 200 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

The first surface 102 of the silicon substrate 100 may be partially removed by a grinding process such as a chemical mechanical polishing (CMP) process. Thus, a thickness of the silicon substrate 100 may be reduced to a desired thickness. First end portions of the through electrodes 200 may be exposed from the lower surface 104 of the silicon substrate 100. Second end portions opposite to the first end portions of the through electrodes 200 may be exposed from the first surface 102 of the silicon substrate 100.

The first landing pads 330 may be electrically connected to the through electrodes 200. The second landing pads 340 may be electrically connected to the first circuit patterns 120*a* through the connection wires 140. Since the through opening area OA, in which the through electrodes 200 are provided, is provided in the first circuit pattern area PA1 in which the first circuit patterns 120*a* are provided, the first landing pads 330 may be provided between the second landing pads 340. Since the first landing pads 330 are provided between the second landing pads 340, lengths of the redistribution wires 320 connecting the first and second landing pads 330 and 340 to each other may be shortened. Since the lengths of the redistribution wires 320 are shortened, space utilization in the redistribution wiring layer 300 may be increased.

Figure 11:
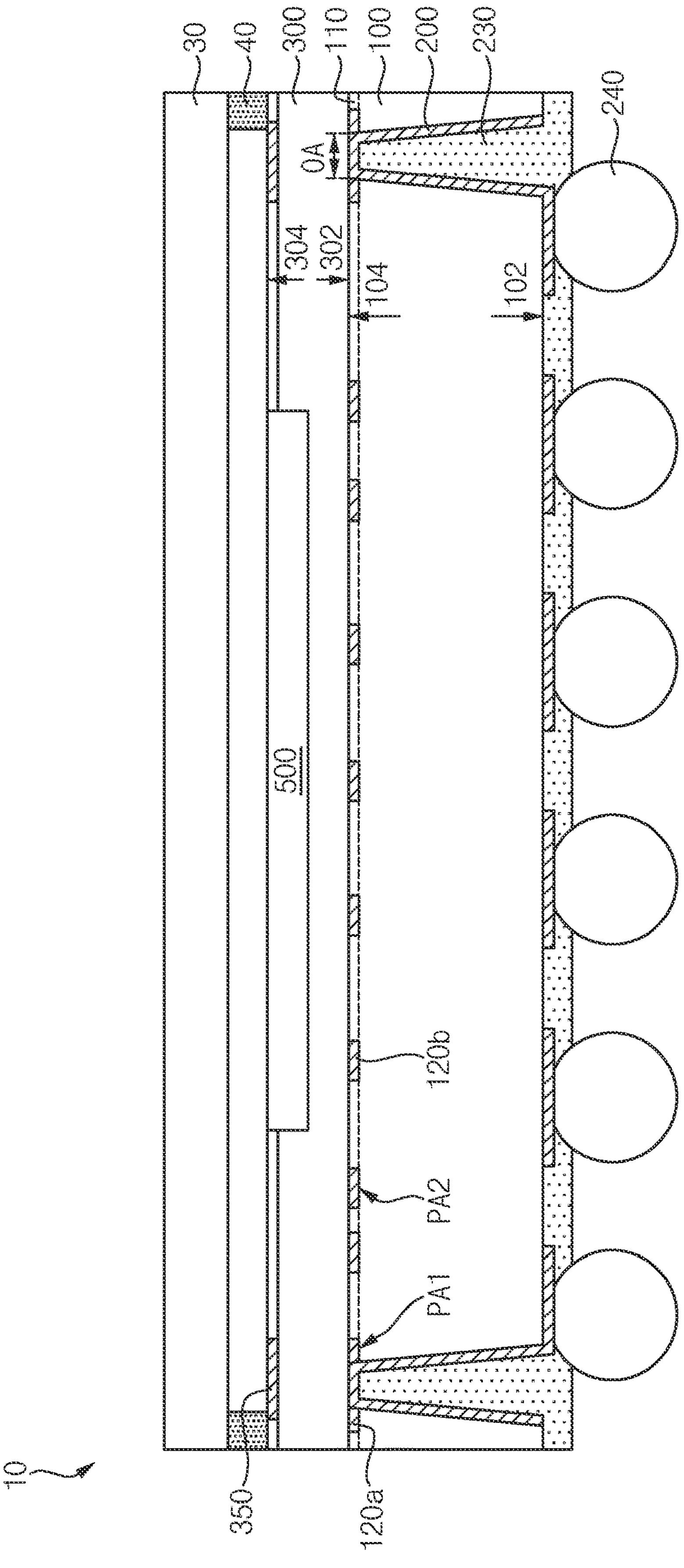

Referring to FIG. 11, an adhesive member 40 may be formed on the fourth surface 304 of the redistribution wiring layer 300, and a transparent plate 30 may be disposed on the adhesive member 40.

In example embodiments, the adhesive member 40 may fill up a gap between the redistribution wiring layer 300 and the transparent plate 30 to reinforce the gap. For example, the adhesive member 40 may include a dam (DAM) shape. The adhesive member 40 may include epoxy resin, UV resin, polyurethane resin, silicone resin, or silica filler.

In example embodiments, the transparent plate 30 may be provided on the adhesive member 40. The transparent plate 30 may include a transparent material capable of transmitting light. The transparent plate 30 may pass light incident from outside to an optical component 500. The transparent plate 30 may protect the optical component 500 from external impact. For example, the transparent plate 30 may include glass, aluminum nitride (AlN), or the like.

Then, conductive bumps 240 may be formed on the second end portions of the through electrodes 200, and an empty space of the through electrodes 200 may be filled up with a protection member 230. The wafer W may be cut along a scribe lane region to form individual semiconductor packages 10.

The conductive bumps 240 may be formed on the second end portions of the through electrodes 200. The conductive bumps 240 may be electrically connected to the first landing pad 330 of the redistribution wiring layer 300 through the through electrode 200. The through electrode 200 may transmit an electrical signal between the first landing pad 330 and the conductive bumps 240. The conductive bumps 240 may provide an electrical movement path capable of electrically connecting the semiconductor package 10 to other semiconductor devices. For example, the conductive bumps 240 may include a C4 bump.

The protection member 230 may be formed on the second surface 104 of the silicon substrate 100. The protection member 230 may include an insulating material to protect the silicon substrate 100 from the outside. The protective member 230 may fill up an empty space of the through electrodes 200. The protection member 230 may protect the through electrodes 200 from the outside (i.e., an environment external to the semiconductor package).

The protection member 230 may include an oxide film or a nitride film, or may include a double layer of an oxide film and a nitride film. The protection member 230 may include an oxide film, for example, a silicon oxide film ($SiO_2$) that is formed by a high-density plasma chemical vapor deposition (HDP-CVD) process.

Then, the wafer W may be cut along the scribe lane region to complete the individual semiconductor packages 10. The wafer W may be cut by a sawing process.

Figure 12:
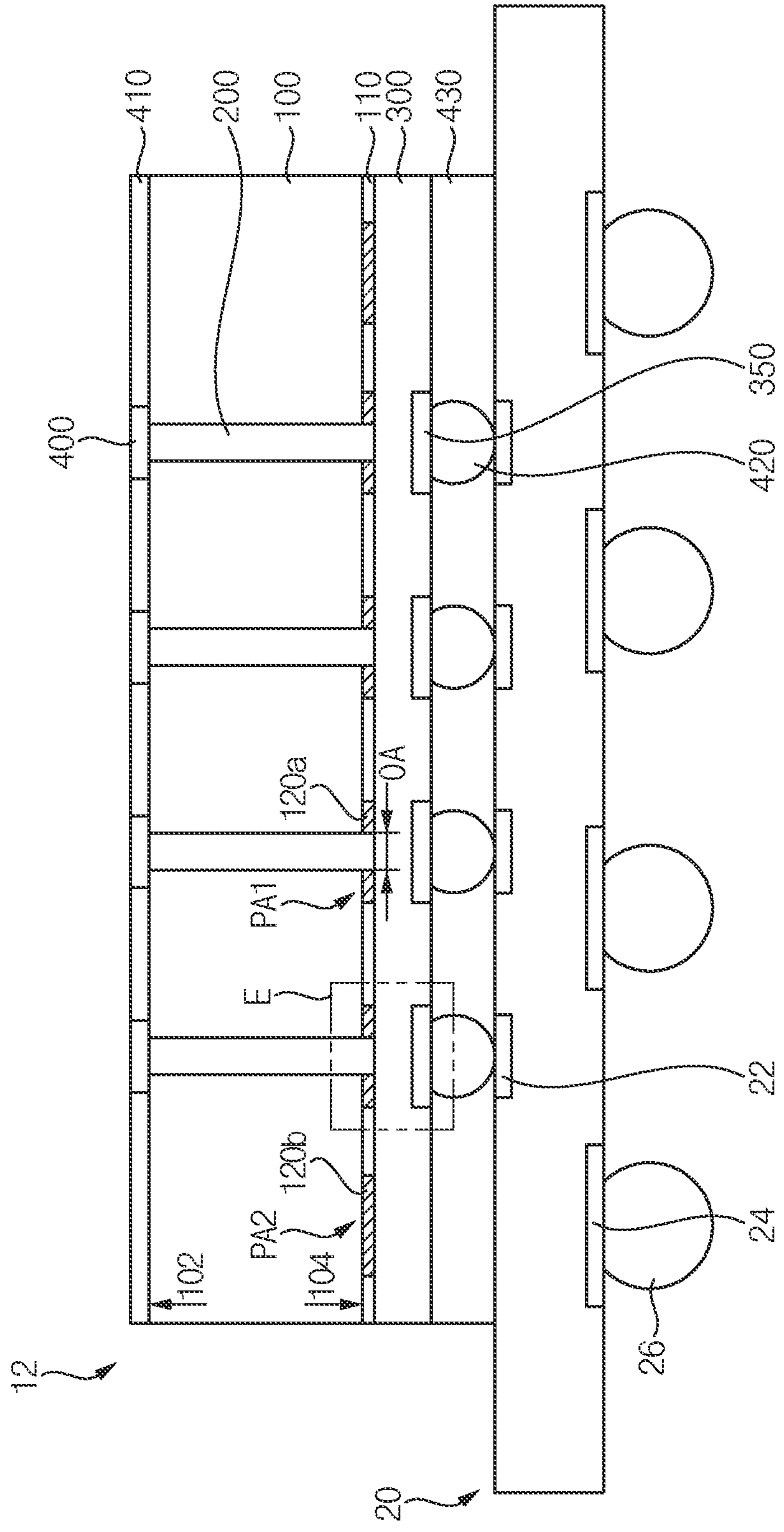
Figure 13:
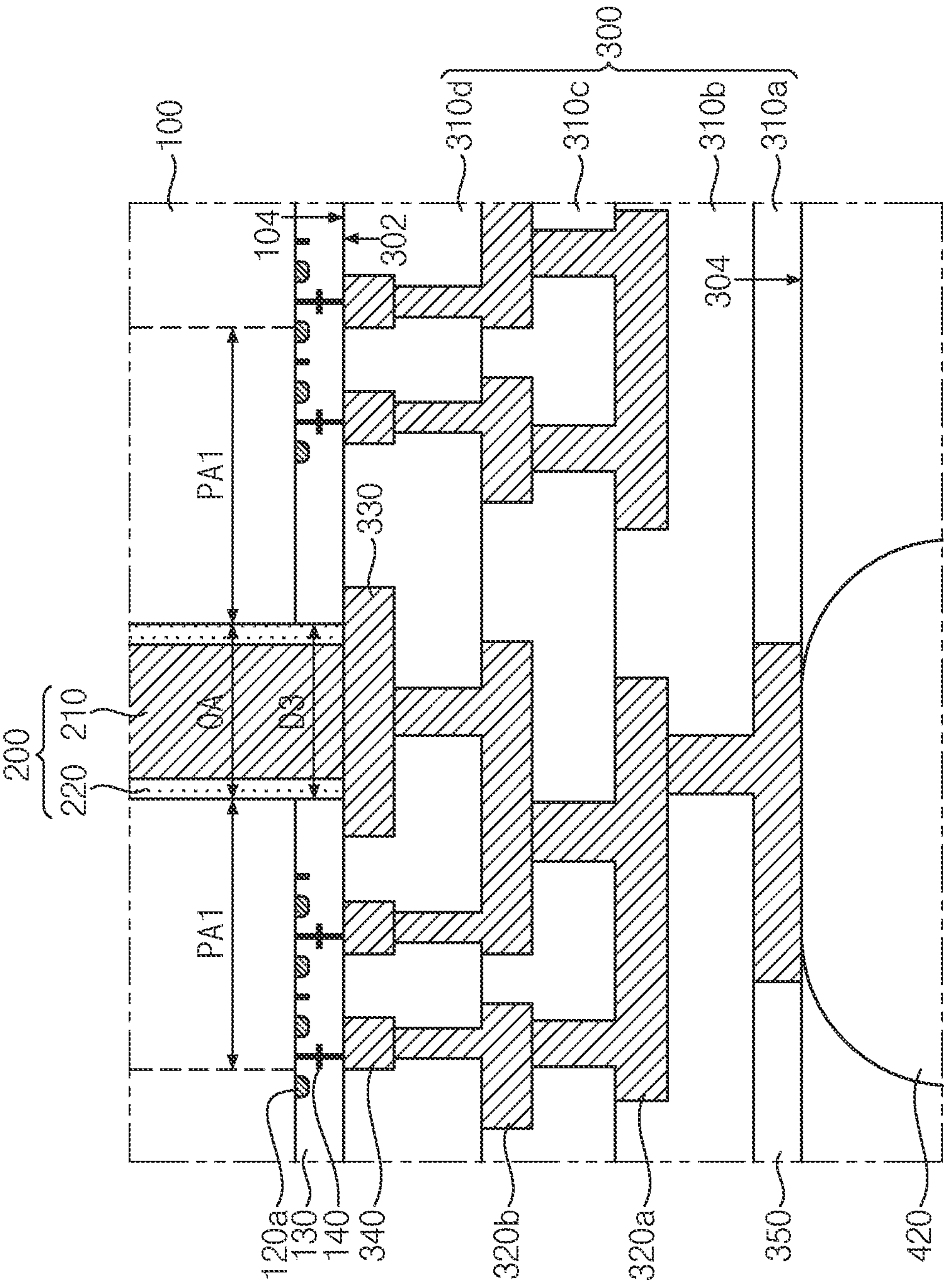
Figure 14:
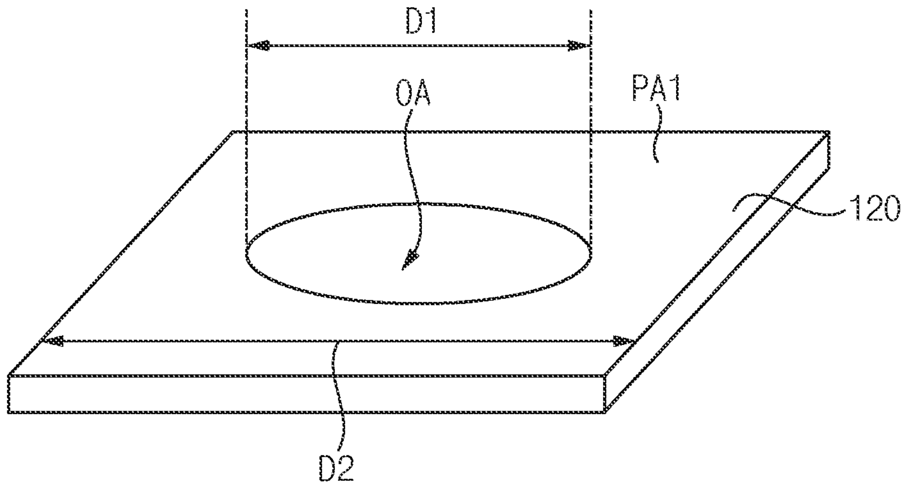

FIG. 12 is a view illustrating a semiconductor device having a semiconductor package in accordance with example embodiments. FIG. 13 is an enlarged cross-sectional view illustrating portion 'E' in FIG. 12. FIG. 14 is a perspective view illustrating a through opening area and a circuit pattern area in FIG. 12. The semiconductor package may be substantially the same as or similar to the semiconductor package described with reference to FIGS. 1 to 3 except for a configuration of portions. Thus, same or similar components are denoted by the same or similar reference numerals, and repeated descriptions of the same components will be omitted.

Referring to FIGS. 12 to 14, a semiconductor device may include a semiconductor package 12, and a package substrate 20 on which the semiconductor package 12 is disposed. The semiconductor device may be a memory device having a stacked chip structure in which a plurality of dies (chips) are stacked.

In example embodiments, the package substrate 20 may be referred to as a substrate that has upper and lower surfaces facing each other. For example, the package substrate 20 may include a printed circuit board (PCB). The printed circuit board may be a multilayer circuit board having vias and various circuits therein.

The package substrate 20 may include first substrate pads 22 exposed from the upper surface, second substrate pads 24 exposed from the lower surface, and external connection bumps 26 provided on the second substrate pads 24. For example, the external connection bumps 26 may include C4 bumps.

An adhesive member 430 may be provided between the package substrate 20 and the semiconductor package 12. For example, the adhesive member 430 may include an epoxy material.

The semiconductor package 12 may include the silicon substrate 100 having an active layer 110, at least one through electrode 200 extending to penetrate the silicon substrate 100, and the redistribution wiring layer 300 provided on a front surface of the silicon substrate 100. The semiconductor package 12 may further include a protection layer 410 provided on a backside surface of the silicon substrate 100, and at least one bonding pad 400 exposed from the protection layer 410. For example, the semiconductor package 10 may be referred to as a semiconductor module capable of forming a complementary metal oxide semiconductor (CMOS) image sensor chip.

In example embodiments, the silicon substrate 100 may have an upper surface 102 and a lower surface 104 opposite to the upper surface. The upper surface 102 of the silicon substrate 100 may be referred to as an inactive surface, and the lower surface 104 may be referred to as an active surface. The active layer 110 having circuit patterns may be provided on the lower surface 104 of the silicon substrate 100. The lower surface 104 may be referred to as a front side surface on which the circuit patterns are formed, and the upper surface 102 may be referred to as a backside surface.

The silicon substrate 100 may have the active layer 110 provided on the lower surface 104. The active layer 110 may include a through opening area OA, and a first circuit pattern area PA1 surrounding the through opening area and providing first circuit patterns 120*a*. The through opening area OA may be referred to as an area where the through electrode 200 is provided. The active layer 110 may further include a second circuit pattern area PA2 in which second circuit patterns 120*b* are provided. The circuit patterns may include the first circuit patterns 120*a* provided in the first circuit pattern area PA1, and the second circuit patterns 120*b* provided in the second circuit pattern area PA2.

The through opening area OA may be referred to as an area that does not include metal materials in the active layer 110. The through opening area OA may be referred to as an area through which the through electrode 200 penetrates the silicon substrate 100 in the thickness direction of the silicon substrate 100. The metal materials may include aluminum (Al), copper (Cu), tin (Sn), nickel (Ni), gold (Au), platinum (Pt), or an alloy thereof.

The through opening area OA of the active layer 110 may have a circular shape or a rectangular shape. The through opening area OA may include any shape without limitation such that the through electrode 200 may penetrate the active layer 110. For example, the diameter D1 of the through opening area OA may be within a range of 40 μm to 60 μm.

The first circuit pattern area PA1 may be referred to as an area that provides the first circuit patterns 120*a* in the active layer 110. The first circuit pattern area PA1 may have a circular shape or a rectangular shape. The first circuit pattern area PA1 may include all shapes without limitation such that the first circuit patterns 120*a* are formed in the active layer 110. For example, the length D2 of the first circuit pattern area PA1 may be within a range of 60 μm to 100 μm.

The second circuit pattern area PA2 may be referred to as an area that provides the second circuit patterns 120*b* in the active layer 110. The first circuit pattern area PA1 may be spaced apart from the first circuit pattern area PA1 in the active layer 110. The active layer 110 may also include the circuit patterns in areas other than the first circuit pattern areas PA1 surrounding the through-opening area OA through the second circuit pattern area PA2. The active layer 110 may also include the circuit patterns in areas other than the first circuit pattern areas PA1 surrounding the through opening area OA through the second circuit pattern area PA2. For example, the second circuit pattern area PA2 may have a circular shape or a rectangular shape. The second circuit pattern area PA2 may include all shapes without limitation such that the second circuit patterns 120*b* are formed in the active layer 110.

The active layer 110 may include an interlayer insulating layer 130, and a plurality of connection wires 140 provided in the interlayer insulating layer 130. The interlayer insulating layer 130 may cover the circuit patterns on the silicon substrate 100. The plurality of connection wires 140 may be electrically connected to the circuit patterns. The plurality of connection wires 140 may be electrically connected to the redistribution wiring layer 300. The interlayer insulating layer may include silicon oxide, carbon-doped silicon oxide, silicon carbonitride (SiCN), or the like.

In example embodiments, the through electrode 200 may penetrate the silicon substrate 100 in first or vertical direction. The first end portion of the through electrode 200 may be exposed at the lower surface 104 of the silicon substrate 100 through the through opening area OA. The first end portion of the through electrode 200 may be electrically connected to the redistribution wiring layer 300. The second end portion opposite to the first end portion of the through electrode 200 may be exposed at the upper surface 102 of the silicon substrate 100.

The first end portion of the through electrode 200 may be electrically connected to the first landing pad 330 of the redistribution wiring layer 300. The second end portion of the through electrode 200 may be electrically connected to the bonding pad 400. The through electrode 200 may transmit an electrical signal between the first landing pad 330 and the bonding pad 400. For example, the diameter D3 of the first end portion of the through electrode 200 may be within a range of 45 μm to 50 μm.

The through electrode 200 may include a conductive plug 210 through which the electrical signal moves, and an insulating thin film 220 surrounding an outer surface of the conductive plug 210. The insulating thin film 220 may block electrical flow between the conductive plug 210 and the circuit patterns that are positioned around the conductive plug. The insulating thin film may include silicon oxide, carbon-doped silicon oxide, silicon carbonitride (SiCN), or the like.

For example, the conductive plug may include copper (Cu), aluminum (Al), tungsten (W), nickel (Ni), molybdenum (Mo), gold (Au), silver (Ag), chromium (Cr), tin (Sn) and titanium (Ti). However, it is not limited thereto, and the through electrode may include a material capable of being bonded by interdiffusion of metals by a high-temperature annealing process.

In example embodiments, the redistribution wiring layer 300 may be provided on the lower surface 104 of the silicon substrate 100. The redistribution wiring layer 300 may include a plurality of redistribution wires 320. The redistribution wiring layer 300 may include a first surface 302 and a second surface 304 opposite to each other. The redistribution wiring layer 300 may include a plurality of redistribution pads 350 provided to be exposed at the lower surface, that is, the second surface 304 of the redistribution wiring layer 300. The redistribution wiring layer 300 may include the first landing pad 330 and the second landing pad 340 provided to be exposed at the upper surface of the redistribution wiring layer 300, that is, the first surface 302.

In example embodiments, the redistribution wiring layer 300 may include a plurality of insulating layers 310*a*, 310*b*, 310*c*, and 310*d* and redistribution wires 320*a* and 320*b* disposed within the insulating layers. The insulating layer may include a polymer or a dielectric layer. The insulating layer may be formed by a vapor deposition process, a spin coating process, or the like. The redistribution wires may be formed by a plating process, an electroless plating process, a vapor deposition process, or the like. The redistribution wires may be electrically connected to the redistribution pads 350 and the first and second landing pads 330 and 340.

In example embodiments, the insulating layers 310 may cover the redistribution wires 320. The first insulating layer (lowermost insulating layer) 310*a* may be provided on the second surface 304 of the redistribution wiring layer 300, and the fourth insulating layer (uppermost insulating layer) 310*d* may be provided on the first surface 302 of the redistribution wiring layer 300.

Particularly, the plurality of redistribution pads 350 may be provided within the first insulating layer 310*a*. Lower surfaces of the redistribution pads 350 may be exposed at the lower surface of the first insulating layer 310*a*, that is, the second surface 304. The first insulating layer 310*a* may have first openings that expose the lower surfaces of the redistribution pads 350.

The first redistribution wires 320*a* may be provided within the second insulating layer 310*b*. The second insulating layer 310*b* may be provided on the first insulating layer 310*a*, and may have second openings that expose the redistribution pads 350. The first redistribution wires 320*a* may be provided on the redistribution pads 350, respectively. The first redistributions 320*a* may contact the redistribution pads 350 through the second openings.

The second redistribution wires 320*b* may be provided within the third insulating layer 310*c*. The third insulating layer 310*c* may be provided on the second insulating layer 310*b*, and may have third openings that expose the second redistribution wires 320*b*. The second redistribution wires 320*b* may be provided on the first redistribution wires 320*a*. The second redistribution wires 320*b* may contact the first redistribution wires 320*a* through the third openings.

The first and second landing pads 330 and 340 may be provided within the fourth insulating layer 310*d*. The fourth insulating layer 310*d* may be provided on the third insulating layer 310*c*, and may have fourth openings that expose the first and second landing pads 330 and 340. The second redistribution wires 320*b* may contact the first landing pad 330 or the second landing pads 340 through the fourth openings.

The first landing pad 330 may be electrically connected to the through electrode 200. The second landing pad 340 may be electrically connected to the first circuit pattern 120*a* through the connection wire 140. Since the through opening area OA, in which the through electrode 200 is provided, is provided in the first circuit pattern area PA1 in which the first circuit patterns 120*a* are provided, the first landing pad 330 may be provided between the second landing pads 340. Since the first landing pad 330 is provided between the second landing pads 340, the lengths of the redistribution wires 320 connecting the first and second landing pads 330 and 340 to each other may be shortened. Since the lengths of the redistribution wires 320 are shortened, space utilization in the redistribution wiring layer 300 may be increased.

In example embodiments, a buffer layer pattern may be provided between the interlayer insulating layer 130 and the redistribution wiring layer 300. The buffer layer pattern may serve to prevent diffusion of a conductive material of the through electrode into the substrate. The buffer layer pattern may include silicon nitride, silicon carbon nitride, or the like.

In example embodiments, the semiconductor package 12 may further include conductive bumps 420 provided on the redistribution pads 350, respectively. The conductive bumps 420 may be provided on the redistribution pads 350 of the redistribution wiring layer 300, respectively. The conductive bump 420 may provide an electrical movement path capable of electrically connecting the semiconductor package 12 to other semiconductor devices. The semiconductor package 12 may be disposed on the first substrate pads 22 of the package substrate 20 via the conductive bumps 420. For example, the conductive bumps 420 may include micro bumps (uBumps).

In example embodiments, the protection layer 410 may be provided on the upper surface 102 of the silicon substrate 100. The protection layer 410 may include an insulating material to protect the silicon substrate 100 from the outside (i.e., an environment external to the semiconductor package 12). The protection layer 410 may include an oxide film or a nitride film, or may include a double layer of an oxide film and a nitride film. The protection layer 410 may include an oxide film, for example, a silicon oxide film ($SiO_2$) that is formed by a high-density plasma chemical vapor deposition (HDP-CVD) process.

In example embodiments, the bonding pad 400 may be provided within the protection layer 410 and electrically connected to the through electrode 200. The bonding pad 400 may be electrically connected to the through electrode 200 at the second end portion opposite to the first end portion of the through electrode 200.

As described above, the active layer 110 may have the through opening area OA in which the through electrode 200 is formed. Since the through opening area OA is not provided with the circuit patterns, the through electrode 200 may not interfere with movement of an electrical signal within the semiconductor package 12. The landing pad 330 electrically connected to the first end portion of the through electrode 200 may be provided on the through opening area OA.

Since the through opening area OA, in which the through electrode 200 is provided, is provided in the circuit pattern area PA1 in which the circuit patterns 120*a* are provided, the first landing pad 330 may be provided between the second landing pads 340 that are electrically connected to the circuit patterns. Since the first landing pad 330 is provided between the second landing pads 340, lengths of the redistribution wires 320 connecting the first and second landing pads 330 and 340 to each other may be shortened. Since the lengths of the redistribution wires 320 are shortened, space utilization of the redistribution wiring layer (metal layer) may be increased.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:

a silicon substrate comprising a first surface and a second surface opposite to the first surface, wherein an active layer is on the first surface, and wherein the active layer comprises a through opening area and a first circuit pattern area surrounding the through opening area and in which first circuit patterns are located;

a through electrode penetrating the silicon substrate and extending into the active layer, the through electrode comprising a first end portion that is exposed at the first surface of the silicon substrate; and a redistribution wiring layer on the first surface of the silicon substrate, the redistribution wiring layer comprising a landing pad and redistribution wires, wherein the landing pad is electrically connected to the first end portion of the through electrode, and wherein the redistribution wires are electrically connected to the landing pad and the first circuit patterns, such that the through electrode is electrically connected to at least one of the first circuit patterns of the active layer through the redistribution wires.

2. The semiconductor package of claim 1, wherein the through electrode further comprises a second end portion that is opposite to the first end portion, and wherein the semiconductor package further comprises a bonding pad on the second end portion that is electrically connected to the redistribution wiring layer through the through electrode.

3. The semiconductor package of claim 2, wherein the redistribution wiring layer further comprises redistribution pads that are electrically connected to the redistribution wires and that are exposed at a fourth surface of the redistribution wiring layer that is opposite to a third surface of the redistribution wiring layer that is in contact with the silicon substrate.

4. The semiconductor package of claim 1, wherein the through opening area has a circular shape.

5. The semiconductor package of claim 4, wherein a diameter of the through opening area is within a range of 40 μm to 60 μm.

6. The semiconductor package of claim 1, wherein the first circuit pattern area has a rectangular shape, and wherein a length of the rectangular shape is within a range of 60 μm to 100 μm.

7. The semiconductor package of claim 1, wherein the active layer further comprises a second circuit pattern area that is spaced apart from the first circuit pattern area and in which second circuit patterns are located, wherein the second circuit pattern area has a circular shape or a rectangular shape.

8. The semiconductor package of claim 1, wherein each of the first circuit patterns comprises at least one of a transistor, a diode and a capacitor.

9. The semiconductor package of claim 1, wherein the through electrode comprises a conductive plug electrically connected to the landing pad, and an insulating thin film extending around an outer surface of the conductive plug.

10. The semiconductor package of claim 1, wherein a diameter of the first end portion of the through electrode is within a range of 45 μm to 50 μm.

11. A semiconductor package, comprising:

a silicon substrate comprising a front surface and a back surface opposite to the front surface, wherein an active layer is on the front surface, and wherein the active layer comprises a through opening area and a circuit pattern area surrounding the through opening area and in which circuit patterns are located;

a through electrode penetrating at least a portion of the silicon substrate and extending into the active layer, the through electrode comprising a first end portion that is exposed at the front surface of the silicon substrate; and a redistribution wiring layer on the front surface of the silicon substrate, the redistribution wiring layer comprising a landing pad and redistribution wires, wherein the landing pad is electrically connected to the through electrode, and wherein the redistribution wires are electrically connected to the landing pad and the circuit patterns, such that the through electrode is electrically connected to at least one of the circuit patterns of the active layer through the redistribution wires.

12. The semiconductor package of claim 11, wherein the through electrode comprises a second end portion that is opposite to the first end portion, and wherein the semiconductor package further comprises a bonding pad on the second end portion that is electrically connected to the redistribution wiring layer through the through electrode.

13. The semiconductor package of claim 12, wherein the redistribution wiring layer further comprises redistribution pads that are electrically connected to the redistribution wires and exposed at a fourth surface of the redistribution wiring layer that is opposite to a third surface of the redistribution wiring layer that is in contact with the silicon substrate.

14. The semiconductor package of claim 11, wherein the through opening area has a circular shape.

15. The semiconductor package of claim 14, wherein a diameter of the through opening area is within a range of 40 μm to 60 μm.

16. The semiconductor package of claim 11, wherein the circuit pattern area has a rectangular shape, and wherein a length of the rectangular shape is within a range of 60 μm to 100 μm.

17. The semiconductor package of claim 11, wherein each of the circuit patterns comprises at least one of a transistor, a diode and a capacitor.

18. The semiconductor package of claim 11, wherein the through electrode comprises a conductive plug electrically connected to the landing pad, and wherein an insulating thin film extends around an outer surface of the conductive plug.

19. The semiconductor package of claim 11, wherein a diameter of the first end portion of the through electrode is within a range of 45 μm to 50 μm.

20. A semiconductor package, comprising:

a silicon substrate comprising a first surface and a second surface opposite to the first surface, wherein an active layer is on the first surface and comprises circuit patterns, a through opening area, and a circuit pattern area surrounding the through opening area and in which the circuit patterns are located;

a through electrode penetrating at least a portion of the silicon substrate and extending into the active layer, the through electrode comprising a first end portion that is exposed at the first surface of the silicon substrate and a second end portion that is opposite to the first end portion;

a redistribution wiring layer on the first surface of the silicon substrate, wherein the redistribution wiring layer comprises a landing pad and redistribution wires, wherein the landing pad is electrically connected to the first end portion of the through electrode, and wherein the redistribution wires are electrically connected to the landing pad and the circuit patterns, such that the through electrode is electrically connected to at least one of the circuit patterns of the active layer through the redistribution wires; and a bonding pad on the second end portion opposite to the first end portion of the through electrode, wherein the bonding pad is electrically connected to the redistribution wiring layer through the through electrode.

* * * * *